United States Patent
Combs et al.

(10) Patent No.: US 7,222,274 B2
(45) Date of Patent: May 22, 2007

(54) TESTING AND REPAIR METHODOLOGY FOR MEMORIES HAVING REDUNDANCY

(75) Inventors: Michael L. Combs, Essex Junction, VT (US); Dale B. Grosch, Burlington, VT (US); Toshiharu Saitoh, South Burlington, VT (US); Guy M. Vanzo, Westford, VT (US)

(73) Assignee: International Business Machines Corporation, Armonk, NY (US)

( * ) Notice: Subject to any disclaimer, the term of this patent is extended or adjusted under 35 U.S.C. 154(b) by 512 days.

(21) Appl. No.: 10/708,342

(22) Filed: Feb. 25, 2004

(65) Prior Publication Data

US 2005/0188287 A1    Aug. 25, 2005

(51) Int. Cl.
*G11C 29/00* (2006.01)

(52) U.S. Cl. ............... 714/721; 714/733; 714/710; 365/201

(58) Field of Classification Search ......... 714/733, 714/710, 721, 742, 718; 365/201
See application file for complete search history.

(56) References Cited

U.S. PATENT DOCUMENTS

| | | | |
|---|---|---|---|
| 5,471,431 A | 11/1995 | McClure | 365/225.7 |
| 5,579,266 A * | 11/1996 | Tahara | 365/200 |
| 5,961,653 A | 10/1999 | Kalter et al. | 714/7 |
| 6,067,262 A | 5/2000 | Irrinki et al. | 365/201 |
| 6,230,292 B1 * | 5/2001 | Duesman et al. | 714/718 |
| 6,330,697 B1 * | 12/2001 | Clinton et al. | 714/721 |
| 6,367,042 B1 | 4/2002 | Phan et al. | 714/733 |
| 6,768,694 B2 * | 7/2004 | Anand et al. | 365/225.7 |
| 6,795,788 B2 * | 9/2004 | Thatcher et al. | 702/119 |
| 6,870,388 B2 * | 3/2005 | Weller | 324/765 |

* cited by examiner

*Primary Examiner*—Albert DeCady
*Assistant Examiner*—Esaw T. Abraham
(74) *Attorney, Agent, or Firm*—Schmeiser, Olsen & Watts; Anthony J. Canale (57) ABSTRACT

A method of testing and repairing an integrated circuit having a total number of fuses for effecting repair of the integrated circuit. The method including: testing a memory array with a set of tests and reserving a first number of the total number of fuses for use in repairing the memory array based on results of the first set of tests; and shmoo testing the memory array by incrementing, decrementing or incrementing and decrementing values of a test parameter until a minimum or maximum value of the test parameter is reached that utilizes a second number of the total number of fuses for use in repairing the memory array to operate at the minimum or maximum value of the test parameter.

26 Claims, 7 Drawing Sheets

| TEST SEQ. | TEST VOLTAGE | TEST RESULTS AND FUSING ACTION |
|---|---|---|
| 1 | V1 = FIRST SHMOO LIMIT | PASS with (M-L)>0 then goto V2, with (M-L)=0 then fuse at V1<br>FAIL with (M-L) = or > 0 then done |
| 2 | V2 = SECOND SHMOO LIMIT | PASS with (M-L)>0 or (M-L)=0 then fuse at V1<br>FAIL with (M-L)<0 then goto V3 |
| 3 | V3 = (V1 +V2)/2 | PASS with (M-L)>0 then goto V4, with (M-L)=0 then fuse at V3<br>FAIL with (M-L)<0 then goto V4' |
| 4 | V4 = (V2 + V3)/2 | PASS with (M-L)>0 then goto V5, with (M-L)=0 then fuse at V4<br>FAIL with (M-L)<0 then goto V5' |
| 5 | V4' = (V1 + V3)/2 | PASS with (M-L)>0 then goto V5", with (M-L)=0 then fuse at V4'<br>FAIL with (M-L)<0 then goto V5''' |
| 6 | V5 = (V2+V4)/2 | PASS with (M-L)>0 then goto V6, with (M-L)=0 then fuse at V5<br>FAIL with (M-L)<0 then goto V6' |

TESTING AND REPAIR METHODOLOGY FOR MEMORIES HAVING REDUNDANCY

BACKGROUND OF INVENTION

1. Field of the Invention

The present invention relates to the field of integrated circuits; more specifically, it relates to a method of testing and repairing memory circuits of integrated circuits by replacement of portions of the memory circuits with redundant circuits.

2. Background of the Invention

Advanced memory circuits include redundant wordlines that can be substituted for failing wordlines by fusing in order to increase yield. However, even though a memory circuit "repaired" by substitution a good redundant wordline for a "failing" wordline by selectively blowing fuses after testing, the "good" wordlines may still contain defects that can cause reliability fails. Further, the yield increase realized by this method is not necessarily maximized for best-case parametric performance but only for test specification parametric performance. Therefore there is a need for a methodology for testing and repairing memory circuits that improves reliability and increases best-case parametric performance yield.

SUMMARY OF INVENTION

A first aspect of the present invention is a method of testing and repairing an integrated circuit having a total number of fuses for effecting repair of the integrated circuit, comprising: testing a memory array with a set of tests and reserving a first number of the total number of fuses for use in repairing the memory array based on results of the first set of tests; and shmoo testing the memory array by incrementing, decrementing or incrementing and decrementing values of a test parameter until a minimum or maximum value of the test parameter is reached that utilizes a second number of the total number of fuses for use in repairing the memory array to operate at the minimum or maximum value of the test parameter.

A second aspect of the present invention is a method of testing and repairing an integrated circuit having a total number of fuses for effecting repair of the integrated circuit, comprising: (a) selecting an integrated circuit chip on a wafer for testing; (b) selecting a test parameter for shmoo testing; (c) testing a memory array on the selected integrated circuit with a set of tests and reserving a first number of the total number of fuses for use in repairing the memory array based on results of the first set of tests; (d) shmoo testing the memory array by incrementing, decrementing or incrementing and decrementing values of a test parameter until a minimum or maximum value of the test parameter is reached that utilizes a second number of the total number of fuses for use in repairing the memory array to operate at the minimum or maximum value of the test parameter; (e) saving the first and second sets of fuse data; and (f) repeating steps (a) through (e) until all integrated circuit chips on the wafer have been selected.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

Figure 1:
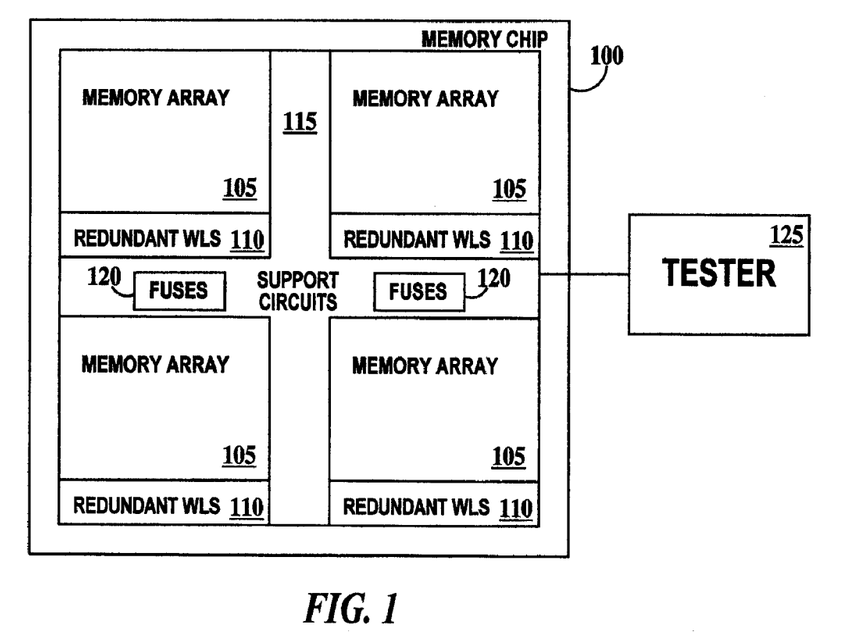
FIG. 1 is an exemplary diagram of a first integrated circuit chip repairable according to the present invention.

FIG. 1 is an exemplary diagram of a first integrated circuit chip repairable according to the present invention. In FIG. 1, a memory chip 100 includes memory arrays 105 having redundant wordlines 110 and support circuits 115 including fuses 120. Generally there is one fuse 120 for each redundant wordline 110. Support circuits 120 are linked to an external tester 125, which supplies test and address data and performs tests on memory chip 100. Support circuits include, for example, address decoders, wordline and bitline drivers and various amplifier circuits. The results of the tests are used to program (also called fuse blow) one or more of fuses 120 to replace a failing wordlines of memory arrays 105 with one or more of redundant wordlines 110. In one example, programming fuses redirects address information from addresses of failing wordlines in memory arrays 105 to redundant wordlines 110. Memory arrays 105 may comprise any type of memory known to the art including but not limited to static random access memory (SRAM), dynamic random access memory (DRAM) and read only memory (ROM). Fuses 120 may be programmable by laser oblation or by passing an electrical current through the fuse causing a metal line to vaporize. Fuses 120 may also comprise antifuses such as gate dielectric fuses wherein a voltage applied between two plates separated by a thin dielectric layer causes formation of a conduction path between the two plates. In the case of laser fuses, tester 125 saves the test data for fuse blow at a fuse blow station. In the case of electrically programmable fuses, tester 125 may perform the programming directly or save the fuse data for electrical fuse blow at a later time.

Figure 2:
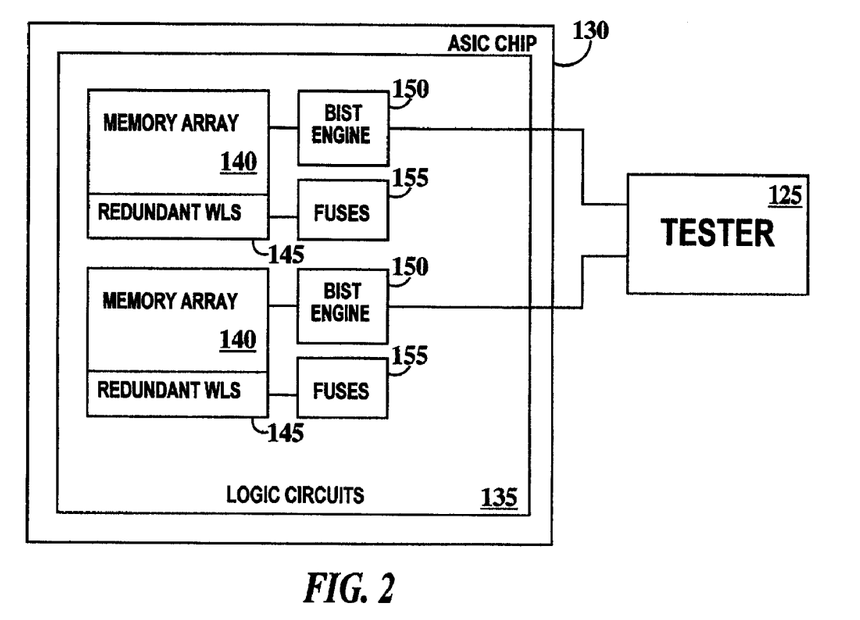
FIG. 2 is an exemplary diagram of a second integrated circuit chip repairable according to the present invention.

FIG. 2 is an exemplary diagram of a second integrated circuit chip repairable according to the present invention. In FIG. 2, an application specific integrated circuit chip (ASIC) 130 includes logic circuits 135 and embedded memory arrays 140 having redundant wordlines 145. ASIC 130 further includes built-in-self-test (BIST) engines 150 and fuses 155. Generally there is one fuse 155 for each redundant wordline 145. BIST engines 150 generate test and address data and tests memory arrays 140. The results of the tests are used to program one or more of fuses 155 to replace a failing wordlines of memory arrays 140 with one or more of redundant wordlines 145. Memory arrays 140 may comprise any type of memory known to the art including but not limited to static random access memory (SRAM), dynamic random access memory (DRAM) and read only memory (ROM). Memory arrays 140 include, support circuits such as, for example, address decoders, wordline and bitline drivers and various amplifier circuits. Fuses 155 may be programmable by laser oblation or by passing an electrical current through the fuse causing a metal line to vaporize. Fuses 155 may also comprise antifuses such as gate dielectric fuses wherein a voltage applied between two plates separated by a thin dielectric layer causes formation of a conduction path between the two plates. In the case of laser fuses, tester 125 saves the test data for fuse blow at a fuse blow station. In the case of electrically programmable fuses, tester 125 or BIST engine 150 may perform the programming directly or save the fuse data for electrical fuse blow at a later time.

Generally testing and fuse blow is performed at wafer level on individual chips. A wafer defined is a semiconductor substrate from which a multiplicity of integrated circuit chips are fabricated simultaneously and which may be later separated from one another by dicing.

Figure 3:
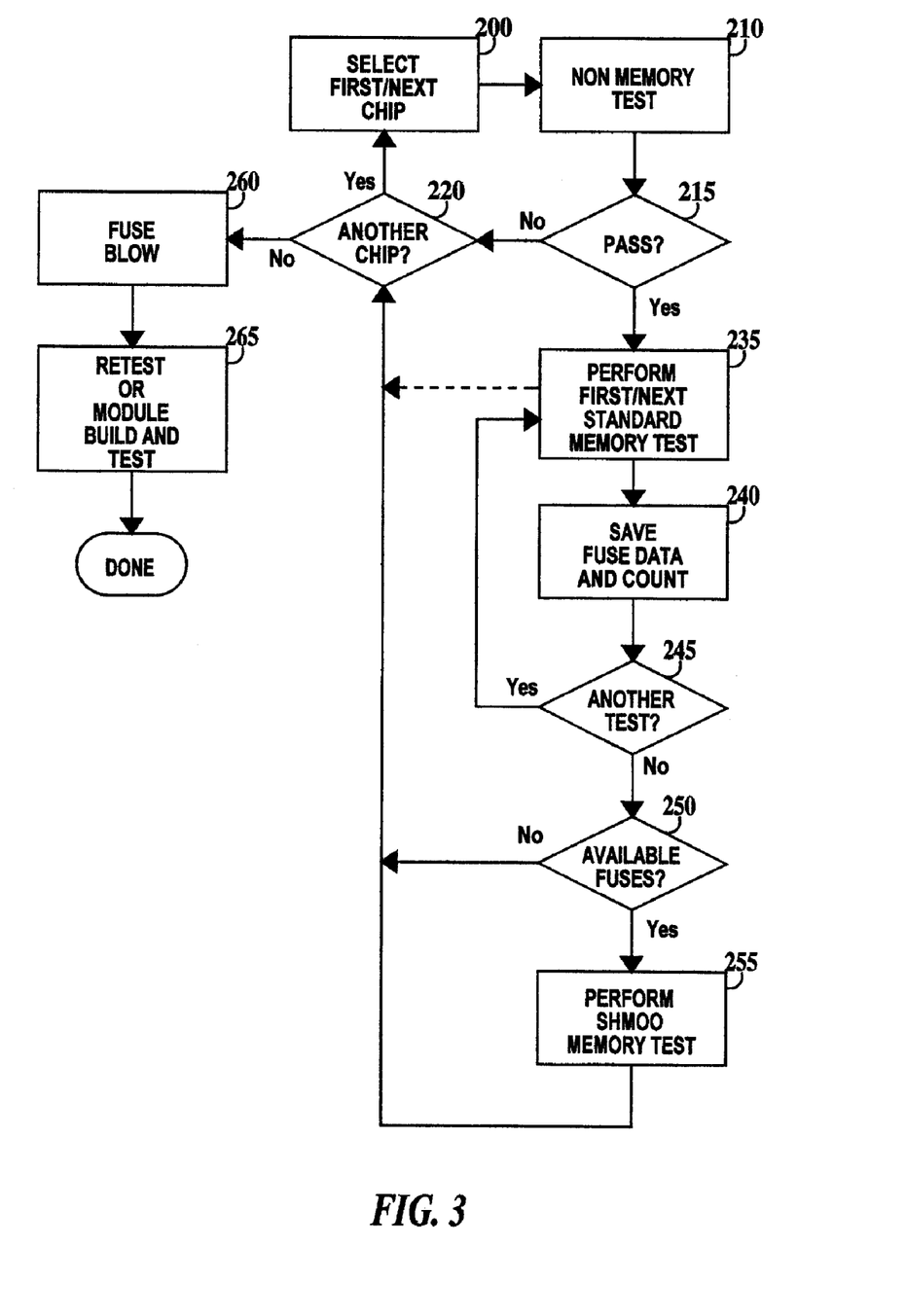
FIG. 3 is a flowchart of a first embodiment of the present invention.

FIG. 3 is a flowchart of a first embodiment of the present invention. The present invention may be performed on either of the chips illustrated in FIGS. 1 and 2 and described supra, or other memory chips or chips containing embedded memory. In step 200, the first/next chip on a wafer to be tested is selected. In step 210, non-memory testing is performed. Non-memory testing includes, for example, power rail short/open testing, memory array support circuit testing and logic circuit testing. In step 215, it is determined if the selected chip has passed the non-memory tests. If the selected chip has not passed the non-memory tests then the method continues to step 220 otherwise the method continues to step 235.

In step 235, the first/next standard memory test is performed. Standard memory tests include, but are not limited to, stuck-at fault testing, transition fault testing, coupling fault testing, testing of the memory array at maximum and minimum memory array operating voltage specification limits (VDDmax and VDDmin) and retention time testing, all of which are well known in the art. Standard memory testing may or may not include testing of the redundant wordlines and disqualifying failing redundant wordlines for use a replacement wordlines for failing memory array wordlines. In the case of "bad" redundant wordlines the number of fuses associated with "bad" wordlines are deducted from the total fuse count (sometimes referred to as M herein) as discussed infra. Step 235 also includes a check that terminates testing if more fuses then the number currently available are required as a result of any standard test and the chip is marked as unfixable and the method continues directly to step 220 as indicated by the dashed line.

In step 240, fuse blow data (which fuse to blow to replace which failing wordline with a redundant wordline) is saved along with a running count of the number of fuses still available. The number of fuses still available is equal to the number of fuses on the chip for a given memory array or portion thereof minus the number of fuses required for wordline replacement. In step 245, it is determined if another test is to be applied. If another test is to be applied then the method loops back to step 235 otherwise the method continues to step 250.

In step 250 it is determined if there are fuses not required for wordline replacement in response to the testing performed in step 235. If there are no fuses (or to small a number to implement the wordline replacements described infra) available the method continues to step 220, otherwise the method continues to step 255. In step 255, shmoo memory testing of one or more test parameters according to the present invention is performed. Shmoo memory testing is illustrated in FIGS. 4 and 5 and described infra.

Returning to step 220, in step 220 it is determined if there is another chip to test. If in step 220 there is another chip to test, then the next chip is selected and steps 210, 215, 235, 240, 245 250 and 255 repeated. It should be noted that used and/or available fuses counts are kept for each chip individually. If in step 220, no further chips remain to be tested then the method continues to step 260. In step 260, fuses on each chip are blown (programmed) base on the testing results obtained in both steps 235 and step 255. Finally in step 265 either retest or module build and test is performed. Fuse blow step 260 is illustrated as occurring after all testing is completed (fuses are reserved and the fuse count is of reserved fuses), which is generally done when the fuses are laser programmable fuses and which may be done when the fuses are electrically programmable fuses. However, in the case of electrically programmed fuses, fuse blow may be performed as part of steps 235 and/or 255 (fuses are used and the fuse count is of used fuses) by leaving out steps 200 and 240 and starting at step 210. Additionally, the method of the present invention is applicable to testing single chips as well as chips still in wafer form as described supra.

Figure 4:
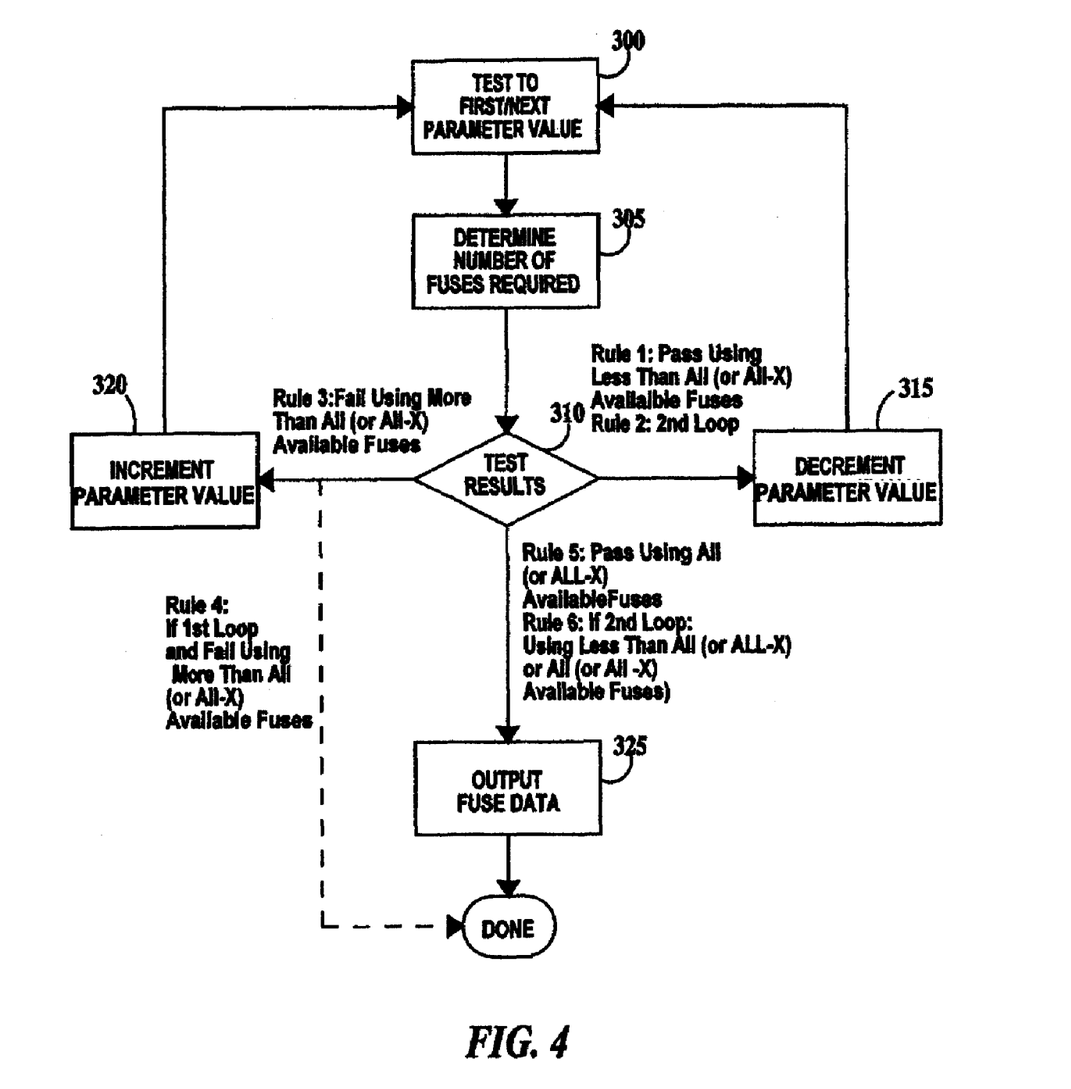
FIG. 4 is a flowchart of a first alternative shmoo memory test step according to the present invention.
Figure 5:
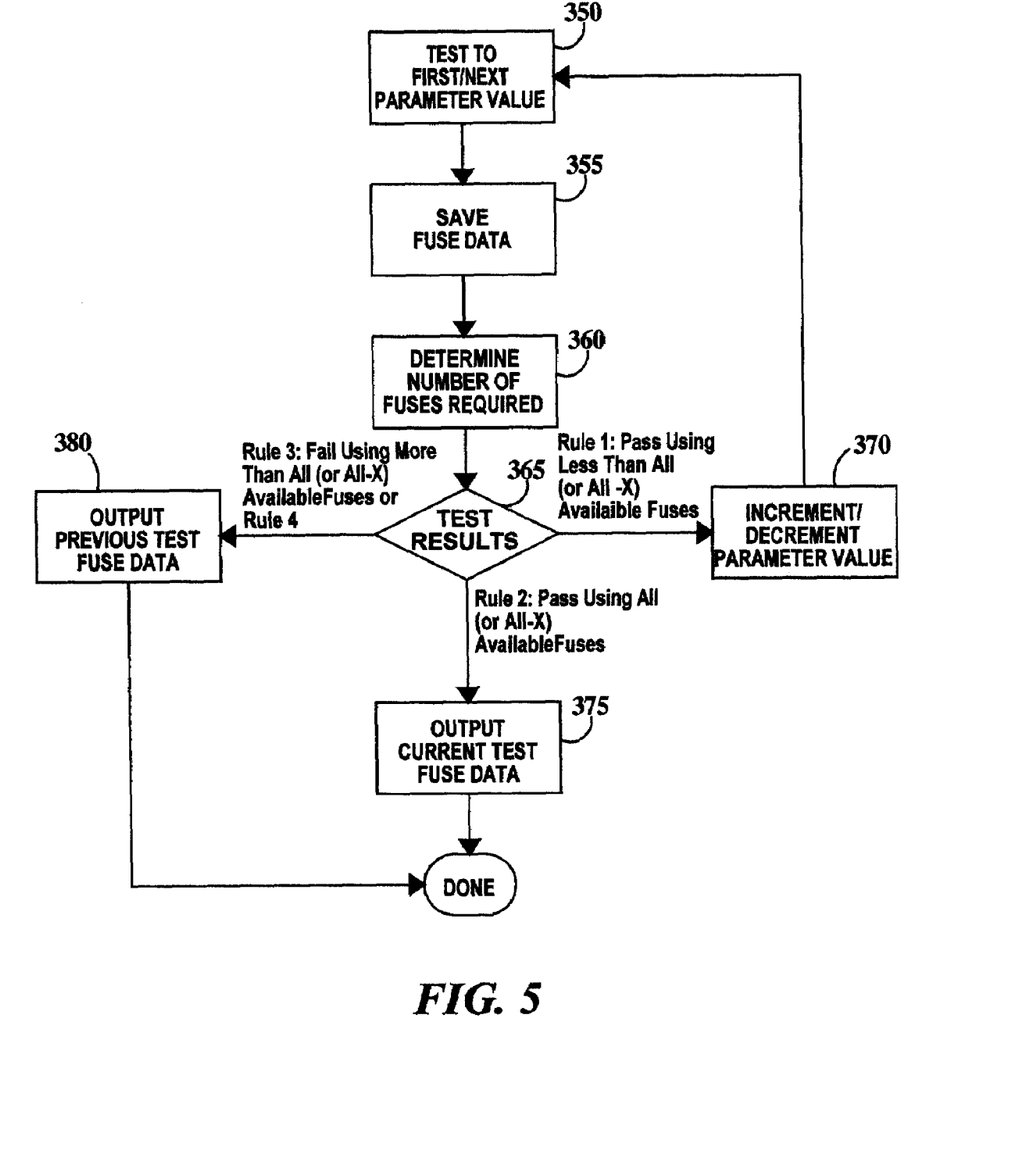
FIG. 5 is a flowchart of a second alternative shmoo memory test step according to the present invention.

FIG. 4 is a flowchart of a first alternative shmoo memory test step 255 of FIG. 3 according to the present invention. FIG. 4 illustrates a binary method of incrementing/decrementing test parameter values. In step 300, a memory test of the array is performed to a first value of a test parameter, for example a minimum operating voltage test is performed using VDD (parameter)=VDDmin (value) and VDD is shmooed lower than VDDmin. In step 305, the number of fuses (if any) required to replace failing memory array wordlines (if any) with redundant wordlines is determined. In step 310, test results are analyzed and three paths are available based on a set of rules.

Rule 1: if in step 310, the memory array passes test (with or without replacement of memory array wordlines with redundant wordlines) at the current value of the test parameter and uses less than all of the available fuses, then the method continues to step 315 where the value of the test parameter is decremented and the method then loops back to step 300. The number of available fuses is the difference between the number of fuses allocated for redundant wordline replacement and the number used or reserved by standard memory tests of step 235 of FIG. 3.

Rule 2: if in step 310 the test result being analyzed is for a test using the second parameter value (the second pass through step 310) then the path to step 315 is prohibited. Rule 2 overrides Rule 1.

Rule 3: if in step 310, the memory array fails test (with or without replacement of memory array wordlines with redundant wordlines) at the current value of the test parameter and uses more than all of the available fuses, then the method continues to step 320 where the value of the test parameter is incremented and the method then loops back to step 300.

Rule 4: if in step the test result being analyzed is for a test using the first parameter value (the first pass through step 310) then the path to step 320 is prohibited and this portion of the method is done. Rule 4 overrides Rule 3.

Rule 5: if in step 310, the memory array passes test (with or without replacement of memory array wordlines with redundant wordlines) at the current value of the test parameter and uses all of the available fuses then the method continues to step 325 where the current fuse blow data is outputted.

Rule 6: if in step 310 the test result being analyzed is for a test using the second parameter value (the second pass through step 310) then the memory array passes test (with or without replacement of memory array wordlines with redundant wordlines) at the current value of the test parameter and uses all of the available fuses or less than all of the available fuses, then the method continues to step 325 where the current fuse blow data is outputted. Rule 6 overrides Rule 5.

Figure 7A:
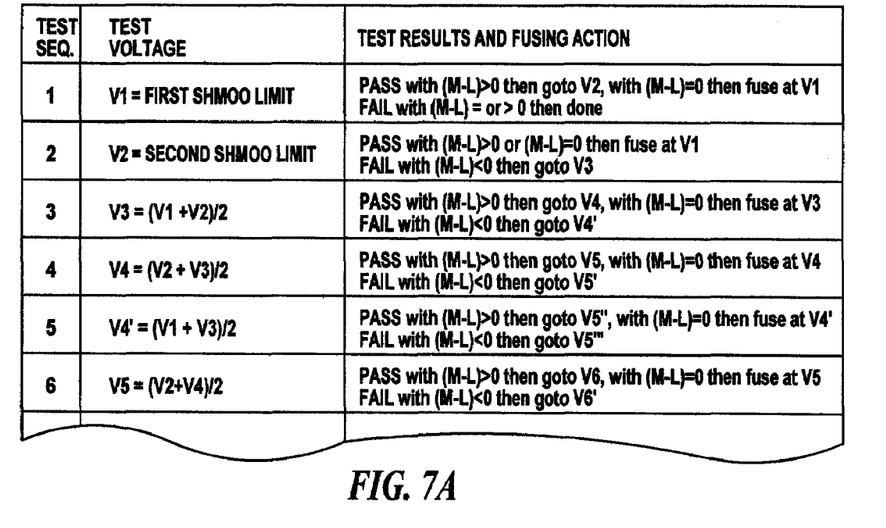
FIG. 7A is a table and FIG. 7B is a diagram illustrating binary shmoo memory testing according to the present invention.
Figure 7B:
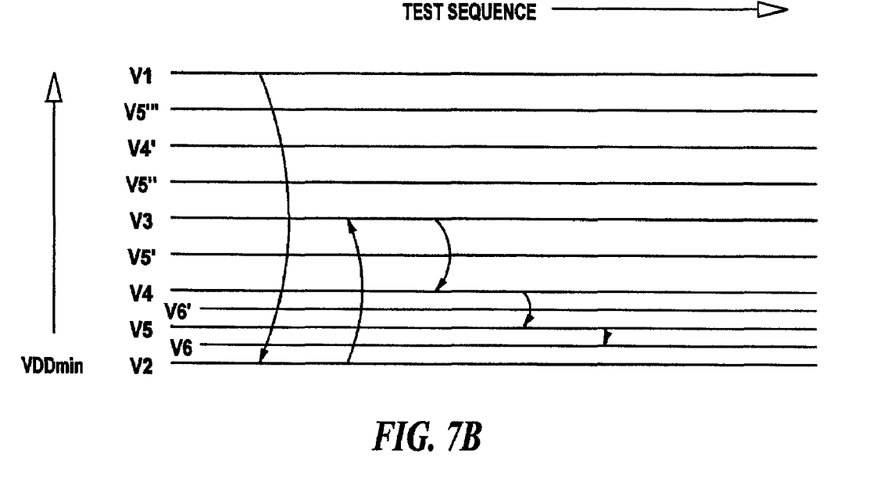

Rules 2, 4 and 6 governing test result analysis are required by the nature of a binary processing methodology. An example binary process is illustrated in FIGS. 7A and 7B and described infra.

Because there is the chance that it is not possible to pass to a parameter value and use exactly all the fuses available, Rules 1, 3, 5 and 6 can be modified to change the phrase "all fuses" to "all available fuses minus a predetermined number of fuses," the "All-X" of Rules 1, 3, 5 and 6 in FIG. 4.

It is possible that some wordlines targeted for replacement by standard memory testing may also be targeted by the shmoo memory testing of FIG. 4. Logic can be added to step 305 and/or step 310 to compensate for this effect by checking the fuse blow data saved in step 240 of FIG. 3 described supra or in step 250 of FIG. 6 described infra. Similarly, the number of passes through steps 300, 305, 310, 315 and 320 can be limited by implementation of a Rule 7 in step 310, wherein Rule 7 states proceed to step 325 if a predetermined number of parameter values (or passes through step 310) have been reached. Rule 7 overrides all other rules.

The aim of the steps illustrated in FIG. 4 and Rules 1 through 7 described supra, is to find the lowest (or highest) value of the chosen test parameter that the memory array can pass test by replacement of memory array wordlines (even if they passed standard memory testing) with redundant wordlines using all or a maximum possible number of the fuses or redundant wordlines not used or reserved by standard testing.

FIG. 5 is a flowchart of a second alternative shmoo memory test step 255 of FIG. 3 according to the present invention. FIG. 5 illustrates a linear method of incrementing or decrementing test parameter values. In step 350, a memory test of the array is performed to a first value of a test parameter, for example minimum operating voltage test is performed using VDD (parameter)=VDDmin (value) and VDD is shmooed lower than VDDmin. In step 355 the current fuse data is saved. In step 360, the number of fuses (if any) required to replace failing memory array wordlines (if any) with redundant wordlines is determined. In step 365, test results are analyzed and three paths are available based on a set of rules.

Rule 1: if in step 365, the memory array passes test (with or without replacement of memory array wordlines with redundant wordlines) at the current value of the test parameter and uses less than all of the available fuses, then the method continues to step 370 where the value of the test parameter is incremented or decremented depending if the test parameter is being shmooed to a maximum or minimum value and the method then loops back to step 350. Again, the number of available fuses is the difference between the number of fuses allocated for redundant wordline replacement and the number used or reserved by standard memory tests of step 235 of FIG. 3.

Rule 2: if in step 365, the memory array passes test (with or without replacement of memory array wordlines with redundant wordlines) at the current value of the test parameter and uses all of the available fuses, then the method continues to step 375 where the current fuse data is outputted.

Rule 3: if in step 365, the memory array fails test (with or without replacement of memory array wordlines with redundant wordlines) at the current value of the test parameter and more than all of the available fuses then the method continues to step 380 where the fuse data from the immediately previous test is outputted.

Because there is the chance that is not possible to pass to a parameter value and use exactly all the fuses available, Rules 1, 2, and 3 can be modified to change the phrase "all fuses" to "all available fuses minus a predetermined number of fuses," the "All-X" in rules 1, 2 and 3 of FIG. 5.

It is possible that some wordlines targeted for replacement by standard memory testing may also be targeted by the shmoo memory testing of FIG. 5. Logic can be added to step 360 and/or step 365 to compensate for this effect by checking the fuse blow data saved in step 240 of FIG. 3 described supra or in step 250 of FIG. 6 described infra. Similarly, the number of passes through steps 350, 360, 365, 370, 375 and 380 can be limited by implementation of a Rule 4 in step 365, wherein Rule 4 states proceed to step 380 if a predetermined number of parameter values (or passes through step 365) have been reached. Rule 4 overrides all other rules.

The aim of the steps illustrated in FIG. 5 and Rules 1 through 4 described supra, is to find the lowest (or highest) value of the chosen test parameter that the memory array can pass test by replacement of memory array wordlines (even if they passed standard memory testing) with redundant wordlines using all or a maximum possible number of the fuses or redundant wordlines not used or reserved by standard testing.

Figure 6:
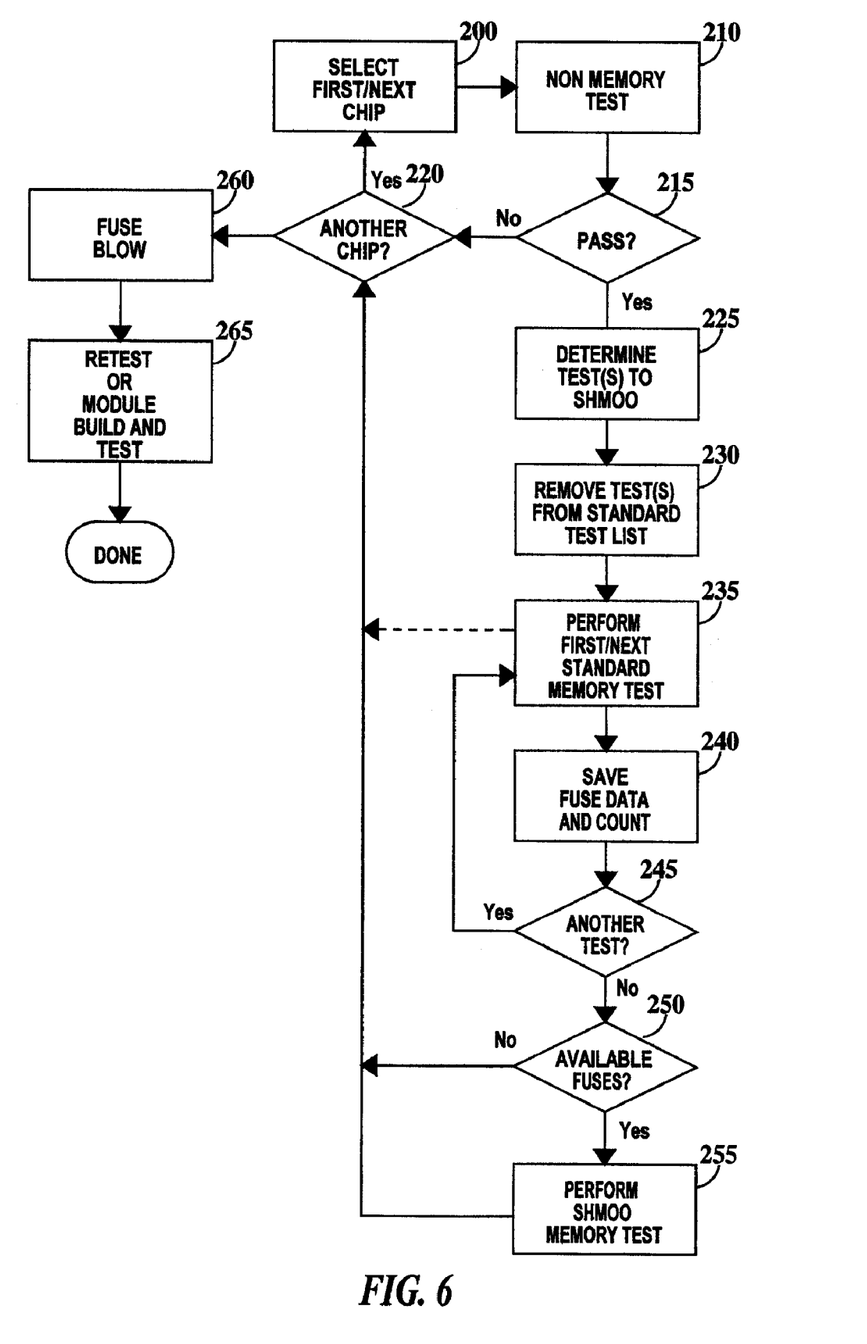
FIG. 6 is a flowchart of a second embodiment of the present invention.

FIG. 6 is a flowchart of a second embodiment of the present invention. In the first embodiment of the present invention the starting point for shmoo memory testing may occur at a value of a test parameter that was previously used during a standard test in step 235 of FIG. 3 as described supra. The second embodiment of the present invention removes the standard testing to this test parameter. The only difference between FIG. 6 and FIG. 3 is the addition of steps 225 and 230. All other steps are identical. In step 225, the test parameter that is to be used in shmoo memory testing in step 255 is identified and in step 230 the tests in step 225 associated with this value of the test parameter are removed from the list of standard memory tests.

FIG. 7A is a table and FIG. 7B is a diagram illustrating a binary shmoo memory testing according to the present invention. In FIG. 7A, M is the total number of fuses available and L is the number of fuses required for all wordline replacements as a result of standard memory testing so M−L is the number of fuse available wordline replacements that result from shmoo memory testing. It is desirable to find a value for the test parameter that uses exactly L or as close L as possible fuses for wordline replacement. Binary shmooing requires maximum and minimum values be predetermined for the parameter being shmooed. In FIG. 7A the maximum value is V1 and the minimum value is V2.

For the first test sequence four events are possible. A pass with more fuses available ((M−L)>0) which results in testing with the next test decremented parameter value, a pass with all available fuses being used ((M−L)=0) which results in outputting the fuse data for the present value of the test parameter, a fail using more fuses available ((M−L)<0) which ends the testing without shmoo test fuse data or a fail using all available fuses ((M−L)=0) which results in ends the testing without shmoo test fuse data.

For the second test sequence three events are possible. A pass with more fuses available ((M−L)>0) which results in outputting the previous test parameter value fuse data, a pass with all available fuses being used ((M−L)=0) which results in outputting the previous test parameter value fuse data or a fail using more fuses than available ((M−L)<0) which results in testing with the next test incremented parameter value.

For all other test sequence s three identical events are possible. A pass with more fuses available ((M−L)>0) which results in testing with the next test decremented parameter value, a pass with all available fuses being used ((M−L)=0) which results in outputting the fuse data for the present value of the test parameter or a fail using more fuses than available ((M−L)<0) which results in testing with the next test incremented parameter value.

Rules 1 through 7 described supra in reference to FIG. 3 are intended to codify the test results and fusing action column of FIG. 7A.

FIG. 7B illustrates one possible test sequence wherein the test parameter is VDDmin and ((M−L)=0) occurred at VD−Dmin=V6.

Figure 8:
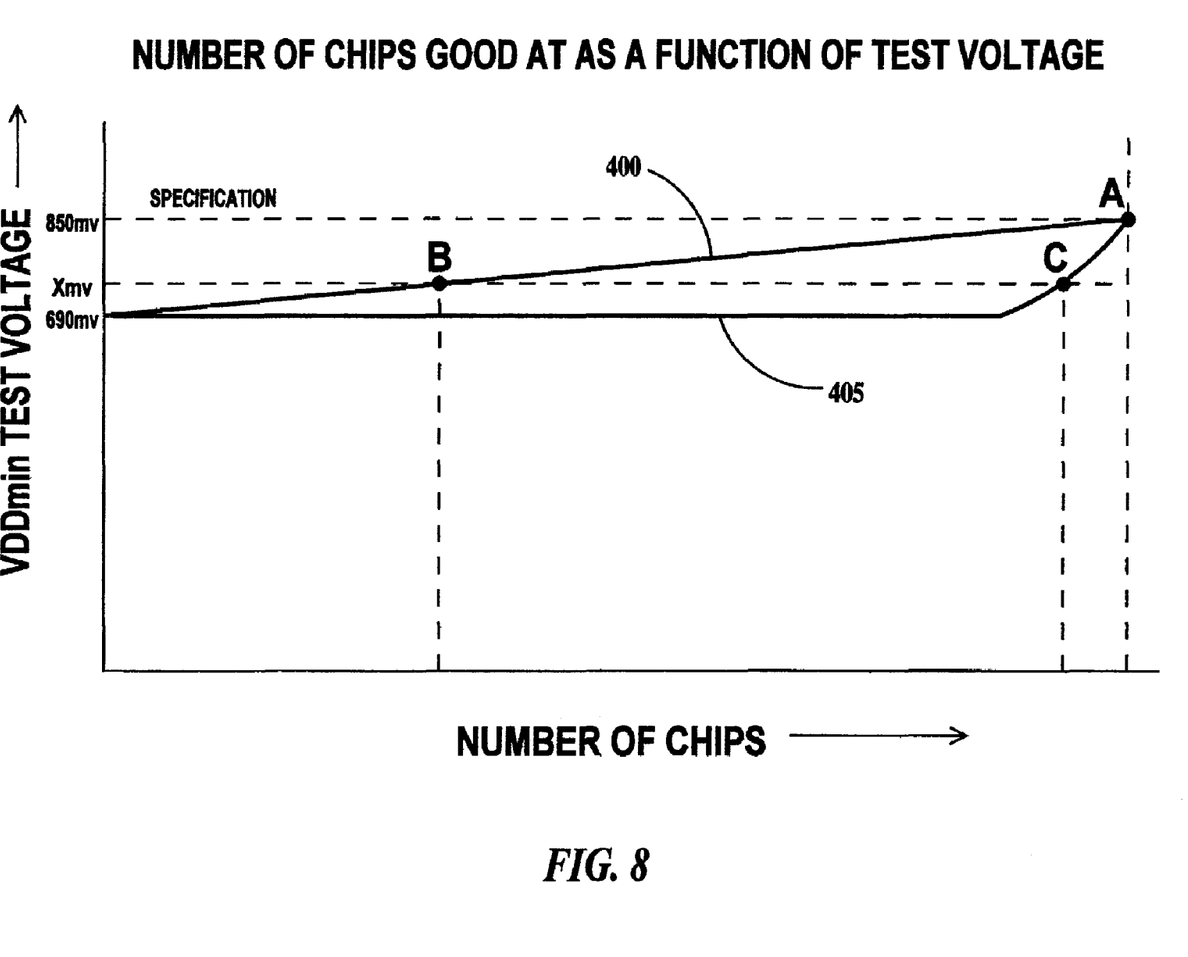
FIG. 8 is a plot of the number of good chips on a wafer as a function of an exemplary test voltage range comparing standard test and repair with test and repair according to the present invention.

FIG. 8 is a plot of the number of good chips on a wafer as a function of an exemplary test voltage range comparing standard test and repair with test and repair according to the present invention. Curve 400 defines the chip frequency distribution that results from standard memory testing of a memory array. Curve 405 defines the chip frequency distribution that results from standard memory testing plus shmoo memory testing of a memory array. 850 mv is the specification for parameter VDDmin and corresponds to the V1 voltage of FIG. 7A. 690 mv corresponds to the V2 voltage of FIG. 7A.

The shmoo memory testing illustrated in FIG. 3 and described supra was applied to similar numbers of chips processed similarly. Curves 400 and 405 meet at a point A. As can be seen point B on curve 400 corresponds to a lesser number of chips passing at Xmv than point C on curve 405 corresponds to. Further, curve 405 shows the effect of shmoo memory testing in that a far larger percentage of total chips are functional at 690 mv than the percentage of total chips only subjected to standard memory testing. Shmoo memory testing thus allows improved yields for sorted parts. Further, stress testing indicates that the curve 405 parts had less defects and are more reliable than curve 400 parts.

Thus, the present invention provides a methodology for testing and repairing memory circuits that improves reliability and increases best-case parametric performance yield.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, the method of the present invention may be modified to allow two or more test parameters to be shmooed and the available number of fuses divide among multiple shmoo memory tests. Therefore, it is intended that the following claims cover all such modifications and changes as fall within the true spirit and scope of the invention.

The invention claimed is:

1. A method of testing and repairing an integrated circuit chip having a total number of fuses for effecting repair of said integrated circuit, comprising:
reserving a first number of said total number of fuses for use in repairing said memory array based on results of a set of standard memory tests;
performing said set of standard memory tests; and
shmoo memory testing said memory array by incrementing, decrementing, or both incrementing and decrementing values of a test parameter until a predetermined minimum or a predetermined maximum value of said test parameter is reached and that requires no more than a second number of said total number of fuses for use in repairing said memory array to operate at said predetermined minimum or said predetermined maximum value of said test parameter.

2. The method of claim 1, wherein (i) said first number of fuses plus said second number of fuses equals said total number of fuses or (ii) said first number of fuses plus said second number of fuses plus a third number of fuses equals said total number of fuses.

3. The method of claim 1, further including:
collecting fuse data based on said standard memory testing; and
collecting fuse data based on said shmoo memory testing.

4. The method of claim 3, further including:
programming said fuses to effect repair of said memory array based on said fuse data based on said standard memory testing and based on said fuse data based on said shmoo memory testing.

5. The method of claim 1, wherein said test parameter is the minimum specified operating voltage of said memory array.

6. The method of claim 1, further including:
repairing said memory array based on results of said standard memory testing by replacement of one or more wordlines in said memory array with one or more redundant wordlines; and
repairing said memory array to operate at said minimum or maximum value of said test parameter of said shmoo memory testing by replacement of one or more wordlines in said memory array with one or more redundant wordlines.

7. The method of claim 1, wherein said incrementing, decrementing or incrementing and decrementing values of said test parameter until a minimum or maximum value of said test parameter is reached comprises a binary process.

8. The method of claim 1, wherein said memory array comprises static random access memory cells or dynamic random access memory cells.

9. The method of claim 1, wherein said memory array is an embedded memory array.

10. The method of claim 1, wherein said incrementing, decrementing or incrementing and decrementing values of said test parameter until a minimum or maximum value of said test parameter is reached comprises a linear-process.

11. the method of claim 1, further including:
before performing said set of standard memory tests, reserving said second number of said total number of fuses.

12. The method of claim 1, further including:
terminating schmoo memory testing when a current value of said test parameter requires more than said second number of said total number of fuses for use in repairing said memory array to operate at said current value of said parameter.

13. A method of testing and repairing integrated circuit chips having a total number of fuses for effecting repair of said integrated circuit, comprising:
(a) selecting an integrated circuit chip on a wafer for testing;
(b) selecting a test parameter for shmoo memory testing;

(c) reserving a first number of said total number of fuses for use in repairing said memory array based on results of said set of tests and then testing a memory array on said selected integrated circuit chip with a set of standard memory tests and;

(d), shmoo memory testing said memory array by incrementing, decrementing, or both incrementing and decrementing values of a test parameter until (i) a predetermined minimum or a predetermined maximum value of said test parameter is reached and that requires no more than a second number of said total number of fuses for use in repairing said memory array to operate at said predetermined minimum or said predetermined maximum value of said test parameter;

(e) saving a first set of fuse data based on said standard memory testing of said memory array and saving a second set of fuse data based on said shmoo memory testing of said memory array; and (f) repeating steps (a) through (e) until all integrated circuit chips to be tested have been selected.

14. The method of claim 13, wherein (i) said first number of fuses plus said second number of fuses equals said total number of fuses or (ii) said first number of fuses plus said second number of fuses plus a third number of fuses equals said total number of fuses.

15. The method of claim 13, wherein a number of times said test parameter is incremented or decremented is limited to a predetermined number of times even if said minimum or maximum value of said test parameter is not reached.

16. The method of claim 13, further including:
(g) programming said total number of fuses to effect repair of said memory array based on said first set of fuse data based and based on said second set of fuse data.

17. The method of claim 13, further including:
between steps (c) and (d), programming said fuses to effect repair of said memory array based on said first set of fuse data; and
after step (d), programming said fuses to effect repair of said memory array based on said second set of fuse data.

18. The method of claim 13 further including:
(g) repairing said memory array based on results of said standard memory testing by replacement of wordlines in said memory array with redundant wordlines; and
(h) repairing said memory array to operate at said minimum or at said maximum value of said test parameter by replacement of wordlines in said memory array with redundant wordlines.

19. The method of claim 13, wherein said incrementing, decrementing or incrementing and decrementing values of a test parameter until a minimum or maximum value of said test parameter is reached comprises binary process.

20. The method of claim 13, wherein said test parameter is the minimum specified operating voltage of said memory array.

21. The method of claim 13, wherein said memory array comprises static random access memory cells or dynamic random access memory cells.

22. The method of claim 13, wherein said memory array is an embedded memory array.

23. The method of claim 13, wherein step (c) further includes, before said standard memory testing, removing from said set of tests, any test that tests a parameter that is the same as said test parameter selected in step (b).

24. The method of claim 13, wherein said incrementing, decrementing or incrementing and decrementing values of said test parameter until a minimum or maximum value of said test parameter is reached comprises a linear process.

25. The method of claim 13, further including:
before performing said set of standard memory tests, reserving said second number of said total number of fuses.

26. The method of claim 13, further including:
terminating schmoo memory testing when a current value of said test parameter requires more than said second number of said total number of fuses for use in repairing said memory array to operate at said current value of said parameter.

* * * * *